United States Patent
Kondo

(10) Patent No.: US 10,948,546 B2
(45) Date of Patent: Mar. 16, 2021

(54) METHODS AND APPARATUS FOR BATTERY MANAGEMENT

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 208 days.

(21) Appl. No.: 15/722,884

(22) Filed: Oct. 2, 2017

(65) Prior Publication Data

US 2019/0101595 A1 Apr. 4, 2019

(51) Int. Cl.
| H02J 7/00 | (2006.01) |
| H02J 7/14 | (2006.01) |
| G01R 31/3842 | (2019.01) |
| G01R 31/389 | (2019.01) |
| H01M 10/42 | (2006.01) |
| H01M 10/44 | (2006.01) |

(52) U.S. Cl.
CPC ....... *G01R 31/3842* (2019.01); *G01R 31/389* (2019.01); *H01M 10/42* (2013.01); *H01M 10/44* (2013.01); *H02J 7/0072* (2013.01); *H02J 7/0047* (2013.01); *H02J 7/0048* (2020.01)

(58) Field of Classification Search
USPC ........................................................ 320/162
See application file for complete search history.

(56) References Cited

U.S. PATENT DOCUMENTS

| 9,680,333 | B1* | 6/2017 | Brooks | H02H 7/18 |
| 2003/0057918 | A1 | 3/2003 | Aoki | |
| 2014/0084867 | A1 | 3/2014 | Hamaoka | |
| 2014/0095092 | A1 | 4/2014 | Masanori | |
| 2014/0315047 | A1 | 10/2014 | Cattin | |
| 2014/0356656 | A1 | 12/2014 | Chen | |
| 2015/0070024 | A1* | 3/2015 | Kim | H01M 10/48 |
| | | | | 324/430 |
| 2015/0291044 | A1* | 10/2015 | Adachi | H01M 10/48 |
| | | | | 320/134 |
| 2016/0069963 | A1 | 3/2016 | Hebiguchi | |

(Continued)

FOREIGN PATENT DOCUMENTS

| JP | 2007-010370 A | 1/2007 |
| JP | 2015-025685 A | 2/2015 |

(Continued)

*Primary Examiner* — Alexis B Pacheco

(74) *Attorney, Agent, or Firm* — The Noblitt Group, PLLC; Hettie L. Haines

(57) ABSTRACT

Various embodiments of the present technology comprise a method and apparatus for battery management. In various embodiments, the apparatus comprises a lithium ion battery and a fuel gauge circuit to monitor the resistance and the capacity as the battery ages. The fuel gauge circuit utilizes the resistance and capacity values to compute resistance changes due to both cycle aging and calendar aging separately. The fuel gauge circuit utilizes the change in resistance values to determine aged capacity values. The fuel gauge circuit controls charging/discharging of the battery according to the aged capacity values.

20 Claims, 6 Drawing Sheets

(56) References Cited

U.S. PATENT DOCUMENTS

| | | | | |
|---|---|---|---|---|
| 2016/0254664 A1* | 9/2016 | Huang | ................ | H02J 1/00 |
| | | | | 307/52 |
| 2016/0311330 A1* | 10/2016 | Liu | ................ | B60L 11/1809 |
| 2016/0344068 A1* | 11/2016 | Kim | ................ | G01R 31/382 |
| 2017/0005497 A1* | 1/2017 | Sherstyuk | ............ | H02J 7/0068 |
| 2017/0057650 A1* | 3/2017 | Walter-Robinson | ........................ | |
| | | | | B64D 41/00 |
| 2018/0246174 A1* | 8/2018 | Shimosawa | ........... | H01M 10/48 |

FOREIGN PATENT DOCUMENTS

| | | |
|---|---|---|
| JP | 2015-109221 A | 6/2015 |
| WO | 2017033399 A1 | 3/2017 |

\* cited by examiner

METHODS AND APPARATUS FOR BATTERY MANAGEMENT

BACKGROUND OF THE TECHNOLOGY

"Battery capacity" is a measure (typically in ampere-hours) of the charge stored by the battery, and is determined by the mass of active material contained in the battery. The battery capacity represents the maximum amount of energy that can be extracted from the battery under certain specified conditions.

The effective storage capacity of the battery, however, diminishes with age and undergoes irreversible damage. This damage is caused by various mechanisms including corrosion and other chemical processes, and aging of the internal battery components contributes to the damage as well. Each charge/discharge cycle of the battery also has a similar effect but at an accelerated rate. Accordingly, battery deterioration may be the result of cycle aging, which occurs due to battery charge/discharge cycles, and/or calendar aging, which occurs when the battery sits idle (e.g., during storage). It is observed that the effects of calendar aging are accelerated when the battery is charged above 50% capacity and/or when the temperature is above 55 degrees Celsius. The end result is that as the battery ages and deteriorates, the effective capacity of the battery decreases, reducing the amount of time the battery can supply power to a device. Improved battery performance may be achieved if the deterioration due to cycle aging and calendar aging are estimated separately.

One indicator of the battery's ability to retain charge and ability to power a device is the battery "state of health" (SOH). Many applications use this parameter to estimate battery performance, for example the "run-time" of the battery, which reflects the amount of time the battery will continue to provide power before it dies. An accurate estimate of the run-time is desired to provide alerts to a user.

SUMMARY OF THE INVENTION

Various embodiments of the present technology comprise a method and apparatus for battery management. In various embodiments, the apparatus comprises a lithium ion battery and a fuel gauge circuit to monitor the resistance and the capacity as the battery ages. The fuel gauge circuit utilizes the resistance and capacity values to compute resistance changes due to both cycle aging and calendar aging separately. The fuel gauge circuit utilizes the change in resistance values to determine aged capacity values. The fuel gauge circuit controls charging/discharging of the battery according to the aged capacity values.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, memory devices, semiconductor devices, such as transistors and capacitors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for measuring voltage, measuring current, measuring temperature, carrying out various mathematical computations, and the like.

Figure 1:
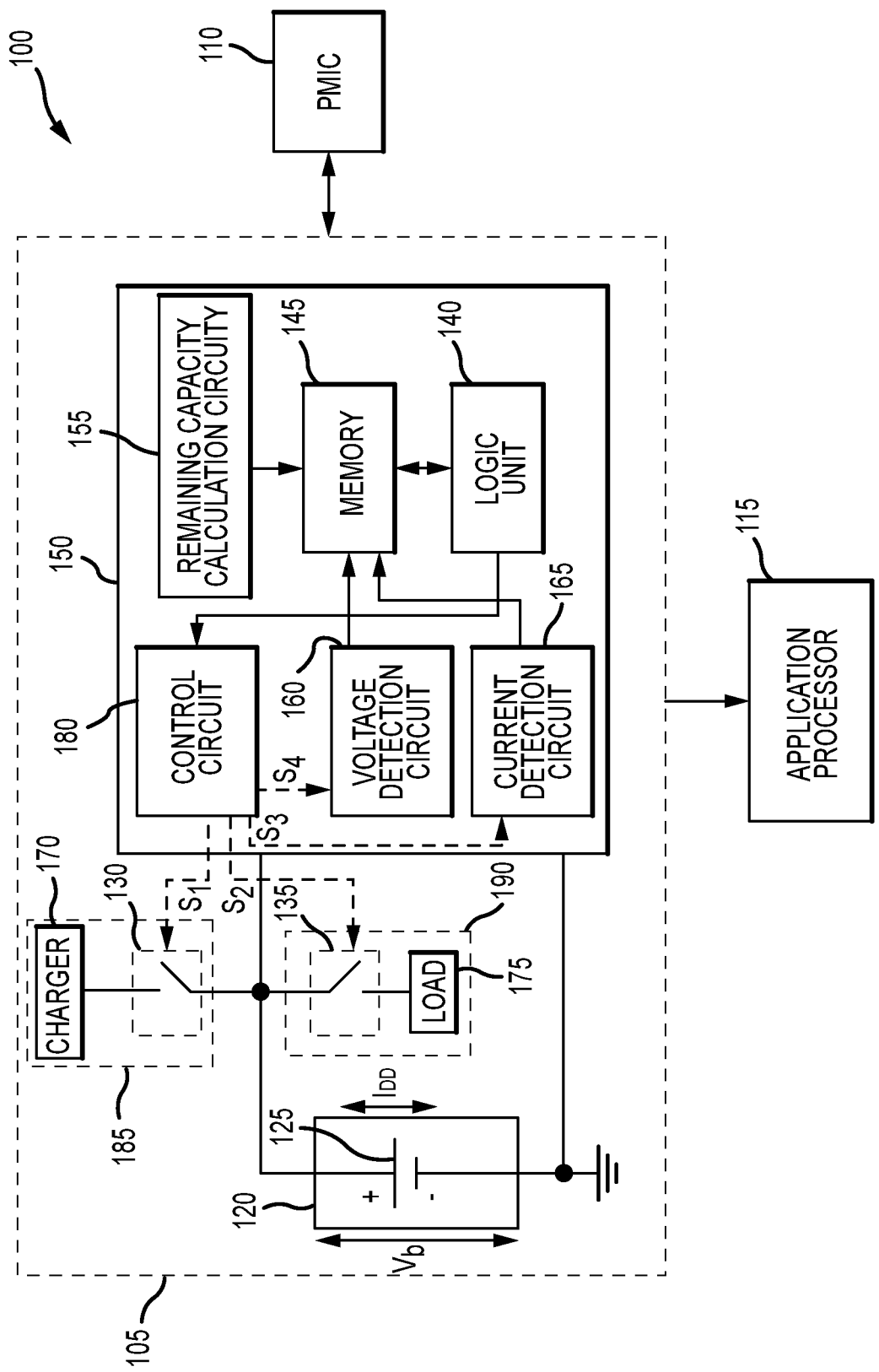
FIG. 1 is a block diagram of an electronic system in accordance with an exemplary embodiment of the present technology.

Methods and apparatus for battery management according to various aspects of the present technology may operate in conjunction with any suitable electronic system and/or device, such as "smart devices," wearables, consumer electronics, portable devices, battery-powered vehicles, and the like. Referring to FIG. 1, an exemplary system 100 may be incorporated into an electronic device powered by a rechargeable battery, such as a lithium ion battery. For example, in various embodiments, the system 100 may comprise a battery system 105, an application processor 115, and a power management IC (PMIC) 110, that operate together to provide suitable power levels to the electronic device.

The battery system 105 provides power and battery information to various components of the electronic device, such as the application processor 115 and the PMIC 110. The battery system 105 may be electrically or communicatively coupled by any suitable method to allow the batter system 105 to transmit data and/or battery information to and from the PMIC 110 and/or the application processor. The battery information may comprise any suitable criteria, such as a capacity of the battery, a run-time of the battery, and the like.

The battery system 105 may comprise any suitable device or system for providing power and battery information. For example, in an exemplary embodiment, the battery system 105 may comprise a battery pack 120, a switchable charger 185, a switchable load 190, and a fuel gauge circuit 150. In various embodiments, the system 100 may further comprise a timing unit (not shown) to operate various circuits according to a predetermined timing cycle.

The battery pack 120 may supply power to the system 100, and may comprise a battery 125, such as a rechargeable lithium ion (Li-ion) battery, a nickel-metal-hydride battery (NiMH), a nickel-cadmium (NiCd) battery, a lithium-ion polymer (LiPo) battery, and the like. In an exemplary embodiment, the battery 125 generates a voltage $V_b$ between a negative electrode and a positive electrode of the battery 125.

The battery pack 120 may also comprise a temperature sensor (not shown) that provides a signal according to the temperature of the battery 125. The temperature sensor may comprise a thermistor (not shown) that generates a thermistor voltage which corresponds to a temperature of the battery 125. The temperature sensor may, however, comprise any appropriate sensor or other device or system for generating a signal corresponding to the temperature of the battery 125.

The switchable charger circuit 185 may be configured to selectively couple to and charge the battery 125. The switchable charger circuit 185 may comprise any suitable device and/or system to generate a current $I_{DD}$ to charge the battery 125. For example, the switchable charger circuit 185 may comprise a charger 170 and a first switch 130. The first switch 130 may operate according to a first control signal S1 from the fuel gauge circuit 150. For example, the first control signal S1 may open the first switch 130 to disconnect the battery 125 from the charger 170, and close the first switch 130 to connect the battery 125 to the charger 170.

The switchable load circuit 190 may be configured to selectively couple to the battery 125 to discharge the battery 125. The switchable load circuit 190 may comprise any suitable device and/or system to draw a current $I_{DD}$ from the battery 125. For example, the switchable load circuit 190 may comprise a load 175 and a second switch 135. The second switch 135 may operate according to a second control signal S2 from the fuel gauge circuit 150. The second control signal S2 may open the second switch 135 to disconnect the battery 125 from the load 175, and close the second switch 135 to connect the battery 125 to the load 175.

The fuel gauge circuit 150 may be configured to receive various inputs and monitor the remaining capacity of the battery 125 (also expressed as a percentage, and referred to as a relative state of charge (RSOC value)) as the battery ages. The fuel gauge circuit 150 may receive signals corresponding to various system data, such as a temperature signal from the temperature sensor and/or control signals, such as from the PMIC 110. The fuel gauge circuit 150 may also generate various types of control signals in response to received input signals and/or the RSOC value of the battery 125, such as control signals to control charging and discharging of the battery 125. The fuel gauge circuit 150 may further be configured to measure various parameters of the battery 125 such as: the battery voltage $V_b$, the current $I_{DD}$, and remaining capacity.

The fuel gauge circuit 150 may also be configured to perform various computations. The fuel gauge circuit 150 may comprise any number of suitable circuits and/or systems and may be implemented in any suitable manner, such as in the form of a large scale integrated (LSI) circuit. For example, in one embodiment, the fuel gauge circuit 150 may comprise a control circuit 180, a voltage detection circuit 160, a current detection circuit 165, a capacity calculation circuit 155, a logic unit 140, and a memory 145.

In various embodiments, the fuel gauge circuit 150 may further comprise a timer (not shown) to track and measure a time interval (period of time). For example, the timer may be utilized to facilitate integration of a current $I_{DD}$ over a predetermined period of time and/or may be used to track periods of charging, discharging, and an open state (a state where the battery is neither charging nor discharging).

The control circuit 180 may be configured to transmit various control signals to activate and/or operate various devices and/or sub-systems within the battery system 105. For example, the control circuit 180 may be communicatively coupled to the switchable charger circuit 185 and to the switchable load circuit 190. The control circuit 180 may transmit the first control signal S1 to selectively couple/decouple the switchable charger 185 to/from the battery 125. Similarly, the control circuit 180 may transmit the second control signal S2 to selectively couple/decouple the switchable load 190 to/from the battery 125. The control circuit 180 may be further configured to transmit a third control signal S3 to activate the current detection circuit 165 and a fourth control signal S4 to activate the voltage control circuit 160.

The voltage detection circuit 160 may be configured to detect and/or measure the voltage $V_b$ of the battery 125. The voltage detection circuit 160 may be coupled to the battery 125, such as a positive terminal (+) of the battery 125. The voltage detection circuit 160 may comprise any circuit and/or system suitable for detecting and/or measuring the voltage $V_b$. In an exemplary embodiment, the voltage detection circuit 160 may be coupled to the memory 145 and configured to transmit data, for example voltage data corresponding to the measured voltage $V_b$, to the memory 145 and/or to the logic unit 140. The voltage detection circuit 160 may detect and/or measure the voltage $V_b$ in response to the fourth control signal S4 from the control circuit 180.

The current detection circuit 165 may be configured to detect and/or measure the current $I_{DD}$ of the battery 125. For example, the current detection circuit 165 may detect and measure a direction and a magnitude of the current $I_{DD}$. The current detection circuit 165 may be coupled to the battery 125 by any suitable method, such as to a positive terminal (+) of the battery 125. The current detection circuit 165 may comprise any circuit and/or system suitable for detecting and/or measuring the current $I_{DD}$. In an exemplary embodiment, the current detection circuit 165 may be coupled to the memory 145 and configured to transmit data, for example current data corresponding to the measured current $I_{DD}$, to the memory 145 and/or to the logic unit 140. The current detection circuit 165 may detect and/or measure the current $I_{DD}$ in response to the third control signal S3 from the control circuit 180.

The memory 145 may be suitably configured to store programs to be executed by the logic unit 140 and various types of battery characteristic data, such as original (new) battery specifications (e.g., original (full charge) capacity of a new battery and original resistance values), aged battery specifications (e.g., aged capacity and aged resistance values), and/or relational data between two variables (e.g., capacity-resistance data, resistance-RSOC data, and OCV-RSOC data). For example, the memory 145 may comprise ROM (read only memory) and RAM (random access memory). A storage area of the memory 145 may comprise a program storage unit to store programs to operate the logic unit 140.

Figure 5:
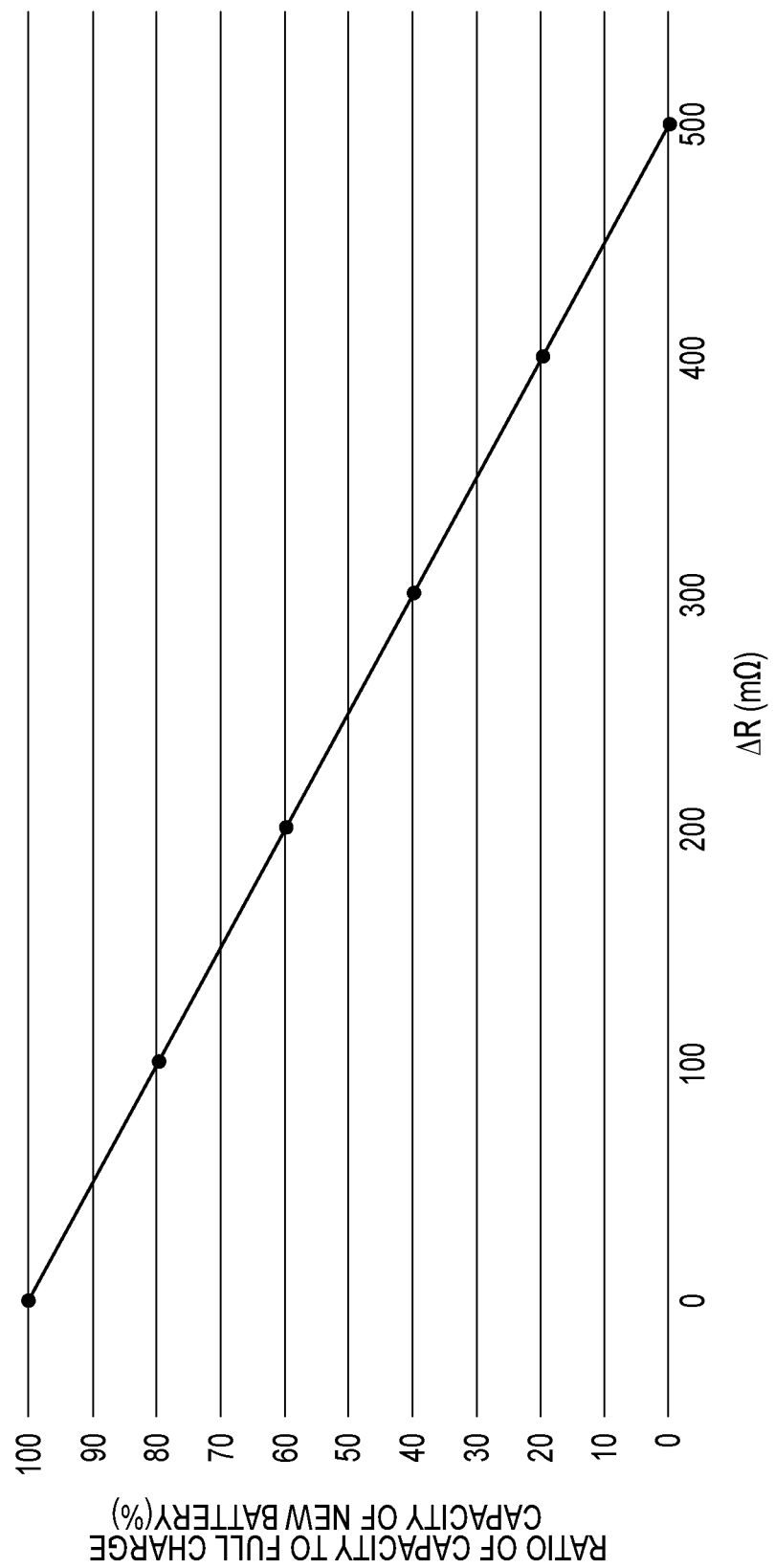
FIG. 5 is a graph illustrating the relationship between a change in resistance and relative state of charge of a battery in accordance with an exemplary embodiment of the present technology.
Figure 6:
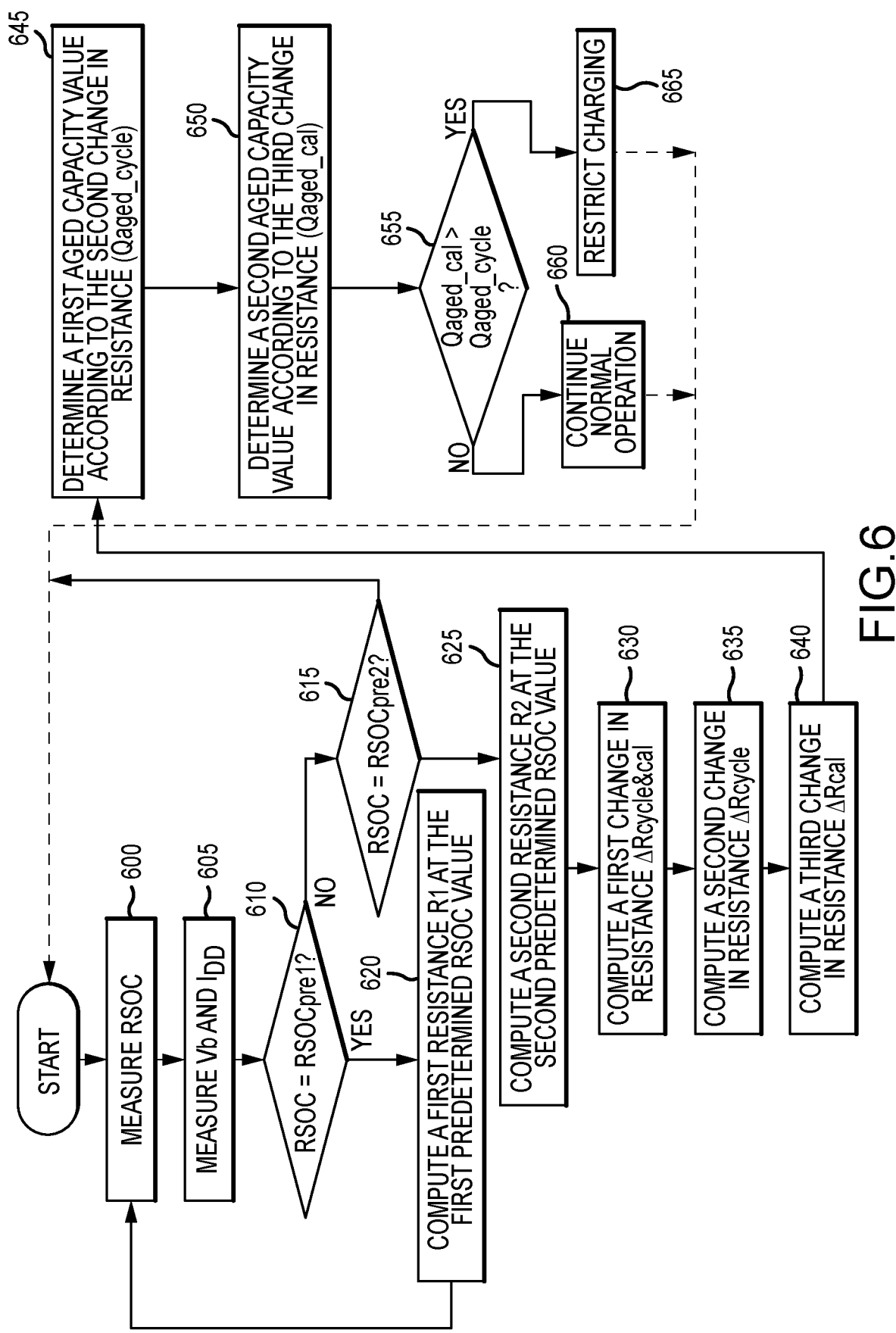
FIG. 6 is a flowchart for managing charging/discharging of a battery in accordance with an exemplary embodiment of the present technology.

The memory 145 may be configured to store various data points between two or more variables, such as in a look-up table or other suitable form. For example, and referring to FIG. 5, the memory 145 may store data indicating a relationship and/or correlation between a ratio of capacity values to a full charge capacity value (when the battery is new) ("the capacity value") and a change in resistance of the battery 125 as the battery 125 ages/deteriorates. In general, as the battery 125 ages/deteriorates, the ratio of capacity to the full charge capacity decreases as the change in resistance increases. A capacity ratio of 1 (i.e., capacity value of 100%) corresponds to a new battery, therefore, there is no change in resistance. As the battery 125 ages/deteriorates, the change in resistance increases, resulting in a capacity ratio of less than 1 (less than 100%) ("an aged capacity value $Q_{aged}$").

The remaining capacity calculation circuit 155 may be suitably configured to determine the remaining capacity (or the RSOC value, when expressed as a percent of a current full charge capacity) of the battery 125. In one embodiment, the remaining capacity calculation circuit 155 may be configured to determine the remaining capacity by measuring the voltage $V_b$ of the battery 125. In general, utilizing the voltage $V_b$ of battery to determine the remaining capacity is referred to as "the voltage method."

In an alternative embodiment, the remaining capacity calculation circuit 155 may be configured to measure the in-and-out-flowing current $I_{DD}$ of the battery 125 over a period of time and reporting the accumulated charge. This may be accomplished with the use of a current shunt, such as a sense resistor (not shown) coupled to the negative terminal (−) of the battery 125, In the present embodiment, the remaining capacity calculation circuit 155 monitors the voltage across the sense resistor as the battery 125 charges and discharges as an indication of the current $I_{DD}$. The current $I_{DD}$ is then integrated over some period of time and reported as the remaining capacity (in mAh or as a percentage).

The remaining capacity calculation circuit 155 may further utilize other suitable parameters, such as a measured battery temperature, to adjust the remaining capacity accordingly. For example, if the remaining capacity is 1,650 mAh, the value 1,650 mAh may be increased or decreased based on the temperature of the battery 125. In general, as the temperature of the battery increases, the battery capacity also increases.

The logic unit 140 may control the fuel gauge circuit 150 and realize various functions by executing various programs stored in the memory 145. The logic unit 140 may further be configured to perform various calculations, extract data from the memory 145, and/or receive relevant data needed to perform the calculations, such as a measured voltage $V_b$ and/or a measured current $I_{DD}$ of the battery 125. The logic unit 140 may comprise any suitable devices and/or systems, and may be realized by the use of software, hardware, or a combination thereof.

For example, the logic unit 140 may be configured to compute the resistance R of the battery 125 using Ohm's Law (i.e., $R=V_b/I_{DD}$). The logic unit 140 may be further configured to compute a change in resistance $\Delta R$ (e.g., $\Delta R=R_m - R_n$).

The logic unit 140 may be configured to extract data from the look-up tables, or other data storage schemes, stored in the memory 145. For example, the logic unit 140 may be configured to extract the capacity value corresponding to a computed change in resistance $\Delta R$, for example according to the data described in FIG. 5.

The logic unit 140 may further estimate a state of health (SOH) value according to the aged capacity value of the battery 125. In an exemplary embodiment, the SOH value is equal to the aged capacity value divided by the new battery ratio, multiplied by 100, (i.e., SOH=($Q_{aged}$/100%)×100 (Equation 1)). The numerical SOH value may correspond to a particular SOH indicator of the battery 125.

The logic unit 140 may further interpret the SOH value and generate an appropriate indicator, such as an indicator light, message, signal, and the like, to inform the user of the SOH of the battery 125. The logic unit 140 may interpret the SOH value to indicate the run-time of the battery 125, and/or the overall remaining life of the battery 125. For example, the logic unit 140 may be adapted to provide an indication to the user whether the battery 125 is in excellent, good, declining, or bad health. The logic unit 140 may further provide some instruction or message to the user to take some specific action, such as generating an indicator to replace the battery 125. In general, the SOH value may be used to indicate the overall SOH of the battery 125. For example, if the SOH value equals 50%, this means that the battery 125 has lost 50% of its charge capacity and the logic unit 140 may interpret this value as a battery with a declining state of health and indicate to the user that the battery 125 should be replaced.

The application processor 115 may control the electronic device, for example based on a control signal received from the battery system 105. Further, the application processor 115 may transfer data outputted from the battery system 105 to a drive circuit (not shown), which may be configured to drive a display unit within the electronic device. The drive circuit may drive the display unit so that the remaining battery capacity, the temperature of the battery, the run-time of the battery, the SOH of the battery, and the like, can be displayed on the display unit based on the data from the application processor 115.

The PMIC 110 may manage the power requirements for the application processor 115, the fuel gauge circuit 150, and/or the battery 125. The PMIC 110 may be coupled to the battery system 105 to ensure that the battery 125 is operating according to a particular set of specifications and to ensure that the battery 125 is providing an appropriate amount of power to the application processor 115. For example, the PMIC 110 may manage the battery operating states, perform DC to DC conversion, perform voltage scaling, perform power sequencing, perform power-source selection, and/or other miscellaneous functions. The PMIC 110 may comprise any circuit and/or system suitable for battery management, voltage regulation, charging functions, and the like. The PMIC 110 may further comprise a memory device, similar to the memory 145, to store configuration data.

In operation, the fuel gauge circuit 150 may determine the extent of deterioration due to calendar aging and cycle aging. The fuel gauge circuit 150 may perform various measurements related to the battery 125 and perform various computations, such as changes in resistance, measure an RSOC value, determine an aged capacity value $Q_{aged}$, and the like. The fuel gauge circuit 150 may utilize the measurements and computations to provide more efficient battery power management.

Figure 2:
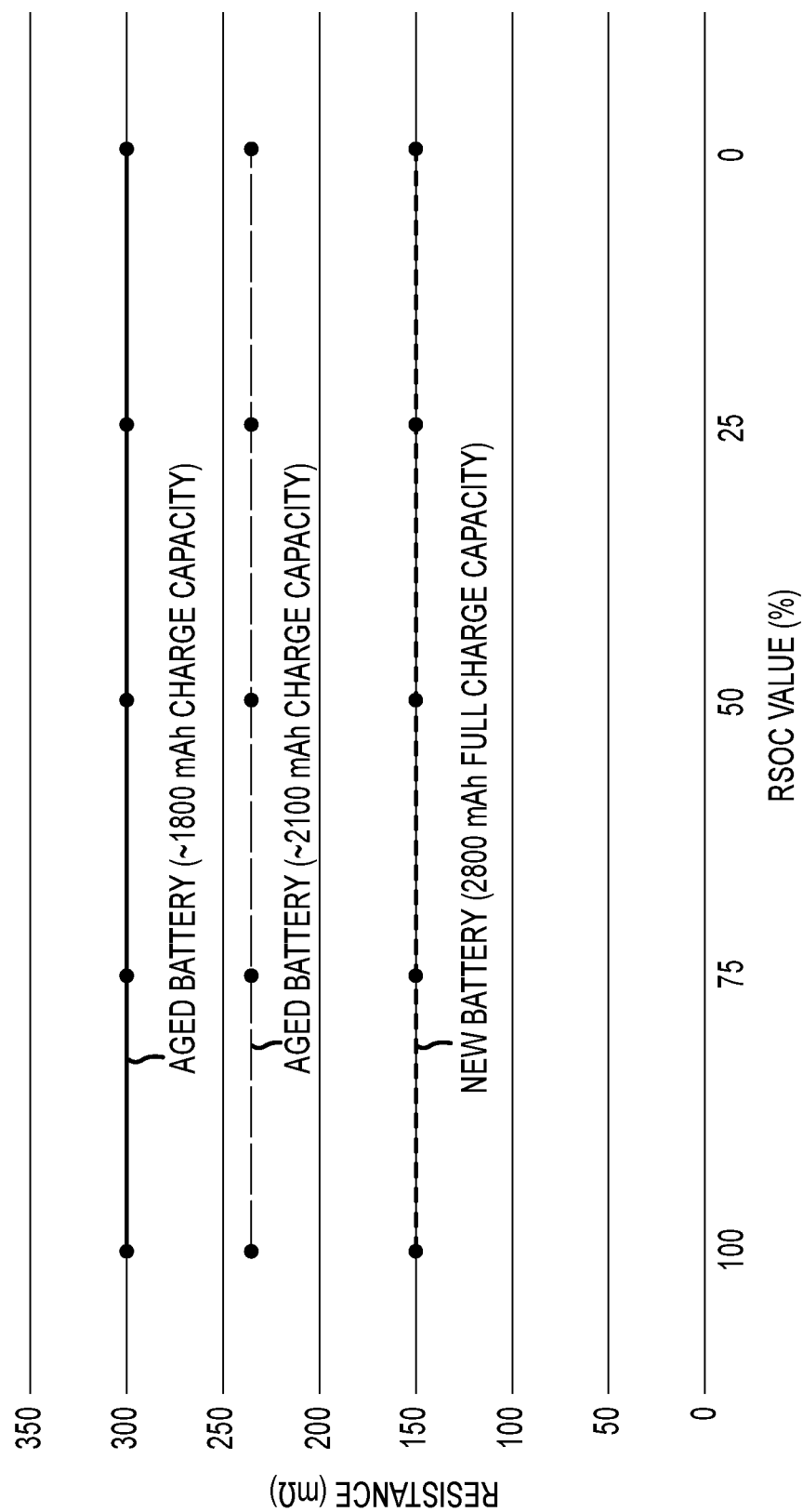
FIG. 2 is a graph illustrating relationships between internal resistance and relative state of charge of a battery as a result of cycle aging in accordance with an exemplary embodiment of the present technology.
Figure 3:
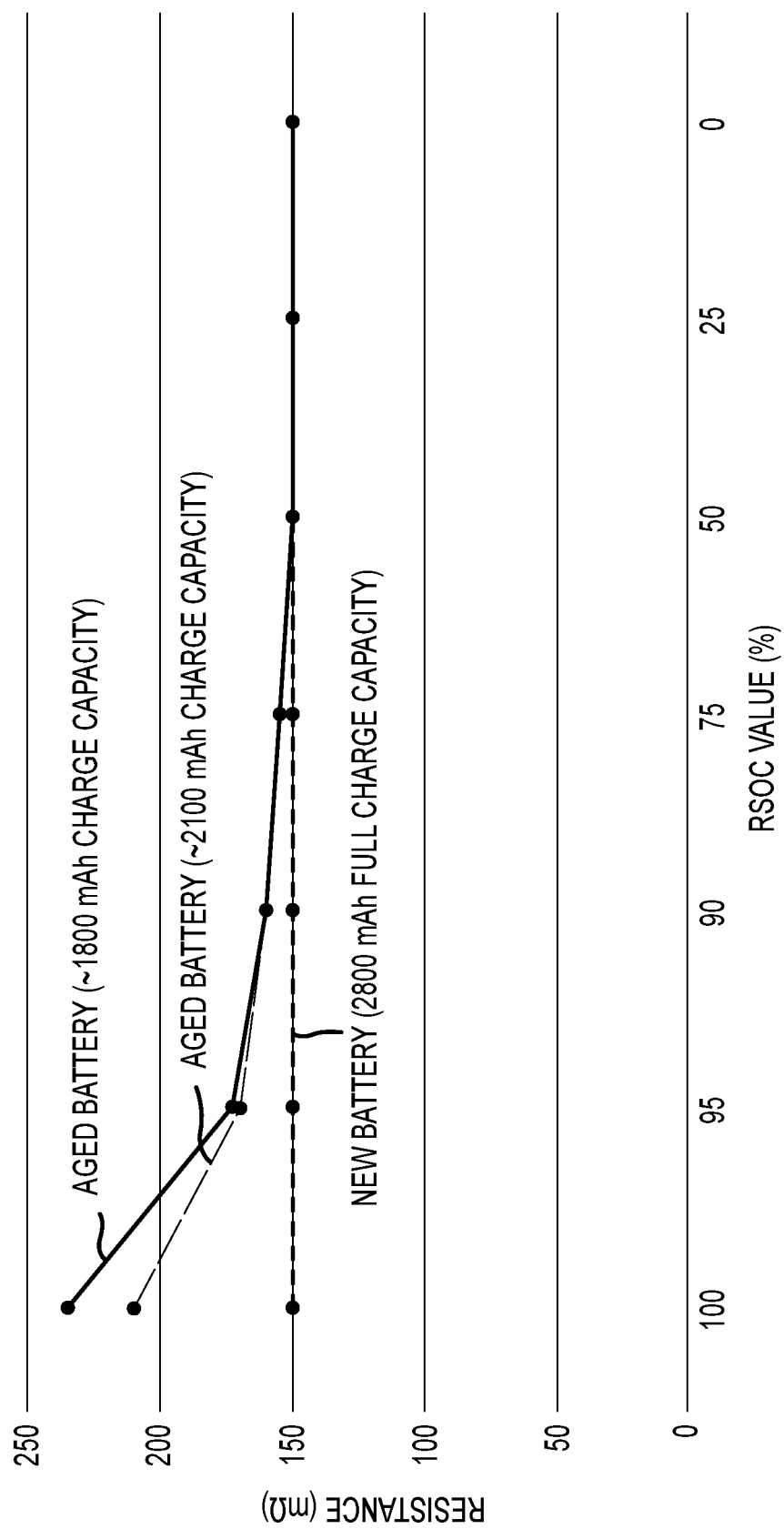
FIG. 3 is a graph illustrating relationships between internal resistance and relative state of charge of a battery as a result of calendar aging in accordance with an exemplary embodiment of the present technology.
Figure 4:
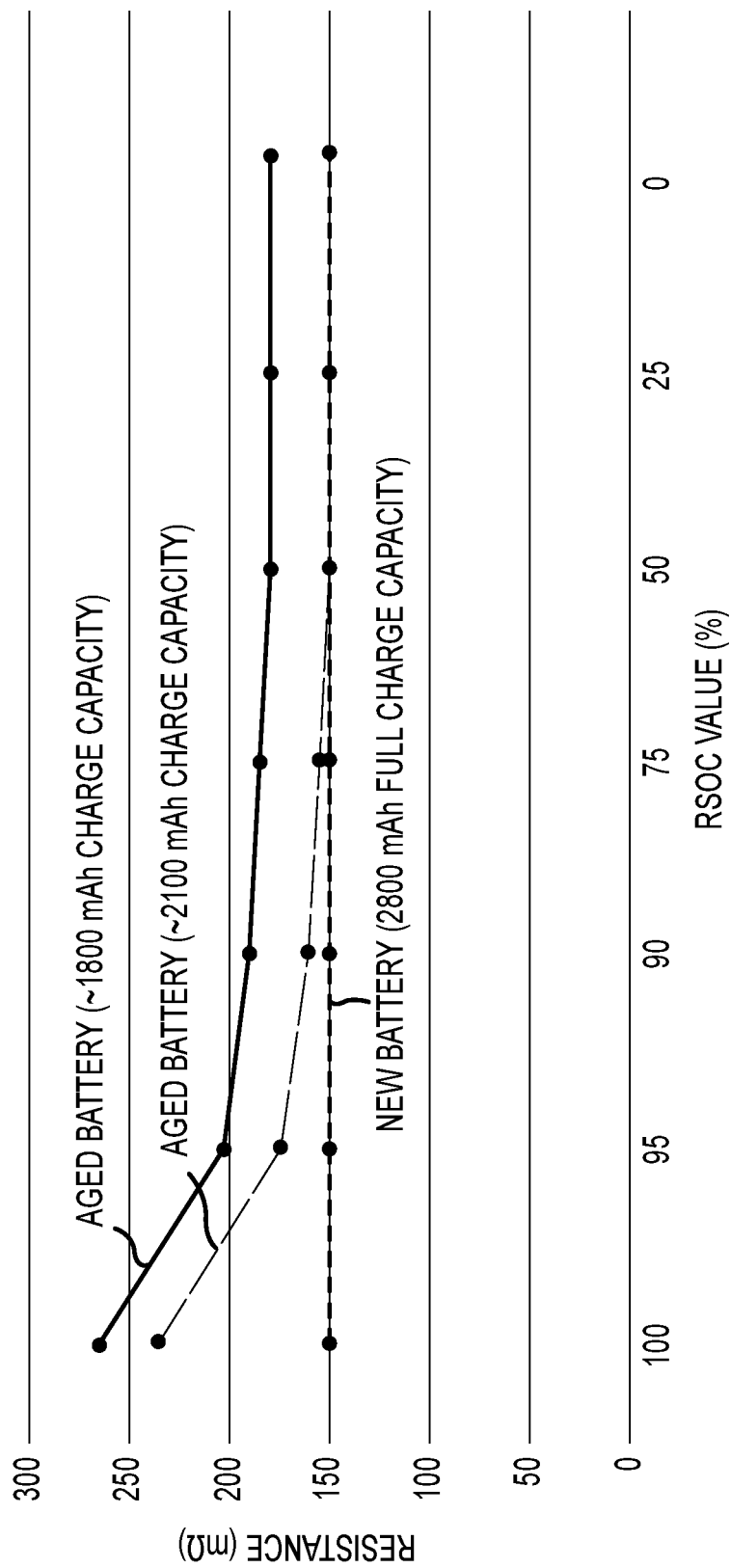
FIG. 4 is a graph illustrating relationships between internal resistance and relative state of charge of a battery as a result of both cycle aging and calendar aging in accordance with an exemplary embodiment of the present technology.

In general, and referring to FIGS. 2-4, it is observed that, as a battery deteriorates due to cycle aging, the resistance remains constant across all RSOC (FIG. 2). In contrast, as a battery deteriorates due to calendar aging, the resistance increases at higher RSOC values, for example RSOC values above 60% (FIG. 3). When the deterioration is a result of both calendar and cycle aging, the change in resistance from a new battery to an aged battery is even greater (FIG. 4). Therefore, deterioration due to calendar aging and cycle aging can be estimated separately, and knowing the extent of each type of deterioration allows for improved battery management and improved performance.

In an exemplary operation, and referring to FIGS. 1-6, the fuel gauge circuit 150 may be configured to measure the RSOC value of the battery 125 (600) using any suitable method. The fuel gauge circuit 150 may measure the voltage $V_b$ and the current $I_{DD}$ (605) using any suitable method. For example, the fuel gauge circuit 150 may utilize the voltage detection circuit 160 to measure the voltage $V_b$ and utilize the current detection circuit 165 to measure the current $I_{DD}$. The fuel gauge circuit 150 may determine if the measured RSOC value equals a first predetermined value $RSOC_{pre1}$, for example 100% RSOC (610). The fuel gauge circuit 150 may then compute a first resistance due to both calendar and cycle aging $R_{cycle\&cal}$ according to the measured voltage $V_b$ and current $I_{DD}$ at the first predetermined RSOC value ($RSOC_{pre1}$) (620). For example, the logic unit 140 may receive the measured voltage $V_b$ and current $I_{DD}$ values and compute the first resistance $R_{cycle\&cal}$ according to Ohm's law, above.

The fuel gauge circuit 150 may continue to monitor and measure the RSOC value, the voltage $V_b$, and current $I_{DD}$ of the battery 125 until the RSOC value reaches a second predetermined RSOC value ($RSOC_{pre2}$), for example 50% RSOC (615). The fuel gauge circuit 150 may then compute a second resistance due to cycle aging $R_{cycle}$ according to the measured voltage $V_b$ and current IDD at the second predetermined RSOC value $RSOC_{pre2}$ (625). For example, the logic unit 140 may receive the measured voltage $V_b$ and current $I_{DD}$ values and compute the second resistance $R_{cycle}$ according to Ohm's law, above.

The fuel gauge circuit 150 may then compute changes in resistance according to the first and second resistance $R_{cycle\&cal}$, $R_{cycle}$ and new battery characteristics. For example, the logic unit 140 may first retrieve data from memory 145 corresponding to the resistance of a new battery $R_{new}$. The logic unit 140 may then compute a first change in resistance $\Delta R_{cycle\&cal}$ (630), where $\Delta R_{cycle\&cal} = R_{cycle\&cal} - R_{new}$. The first change in resistance may correspond to the change in resistance due to both cycle and calendar aging. The logic unit 140 may then compute a second change in resistance $\Delta R_{cycle}$ (635), where $\Delta R_{cycle} = R_{cycle} - R_{new}$. The second change in resistance may correspond to the change in resistance due to cycle aging. The logic unit 140 may then compute a third change in resistance $\Delta R_{cal}$ (640), where $\Delta R_{cal} = \Delta R_{cycle\&cal} - \Delta R_{cycle}$. The third change in resistance may correspond to the change in resistance due to calendar aging.

The logic unit 140 may then utilize the second change in resistance and the third change in resistance to determine aged capacity values for each. For example, and referring to FIG. 5, the logic unit 140 may extract a first aged capacity value $Q_{aged\_cycle}$ from the memory 145 that corresponds to the second change in resistance $\Delta R_{cycle}$ (645), and a second aged capacity value $Q_{aged\_cal}$ that corresponds to the third change in resistance $\Delta R_{cal}$ (650). For example, if a $\Delta R$ equals 200 m-ohm, then the aged capacity value would be 60% (i.e., if $\Delta R_n$=200 m-ohm, then $Q_{aged}$=60%).

According to an exemplary operation, logic unit 140 may then compare first aged capacity value $Q_{aged\_cycle}$ with the second aged capacity value $Q_{aged\_cal}$. For example, the logic unit 140 may determine whether $Q_{aged\_cal}$ is greater than $Q_{aged\_cycle}$ (655). If $Q_{aged\_cal}$ is not greater than $Q_{aged\_cycle}$, then the fuel gauge circuit 150 may continue normal operation of the battery 125, such as normal charging/discharging operations. If $Q_{aged\_cal}$ is greater than $Q_{aged\_cycle}$, this may indicate that the deterioration due to calendar aging may be considerable. In an effort to minimize further damage and deterioration due to calendar aging, the fuel gauge circuit 150 may restrict charging of the battery 125 and/or induce a discharge cycle to reduce the charge capacity to a predetermined value, such as to 60% RSOC. For example, the logic unit 140 may transmit a signal to the control circuit 180, wherein the control circuit 180 may transmit a control signal to the charger circuit 185 to charge the battery 125, or transmit a control signal to the load circuit 190 to discharge the battery 125.

According to various embodiments, the logic unit 140 may also extract a third aged capacity value $Q_{aged\_cycle\&cal}$ that corresponds to the first change in resistance $\Delta R_{cycle\&cal}$, and the fuel gauge circuit 150 may further estimate the SOH value of the battery 125 based on the third aged capacity value $Q_{aged\_cycle\&cal}$ and according to Equation 1 above. Since the third aged capacity value $Q_{aged\_cycle\&cal}$ corresponds to the extent of deterioration due to both cycle and calendar aging, the SOH value computed using the third aged capacity value represents the overall health of the battery 125.

According to various embodiments, the fuel gauge circuit 150 may transmit the SOH value to the application processor 115, wherein the application processor 115 may provide an alert or appropriate notification to the user. For example, the application processor 115 may convert the SOH value to a corresponding indicator and/or any suitable parameter of the health of battery 125, such as "excellent," "average," "poor," "malfunctioning," or the like. The application processor 115 may further notify the user, via a display screen (not shown) and/or an audio component (not shown), to replace the battery 125 if the SOH value falls below a predetermined value. The parameters and/or indicators corresponding to a particular SOH value may be based on the specifications of the battery 125, such as the full charge capacity, temperature, operating specifications, operating environment, number of charge/discharge cycles, and the like.

In various embodiments, the fuel gauge circuit 150 may measure the relevant data points and compute the SOH value according to a predetermined health check schedule. The health check schedule may be based on the particular application and/or environment of the battery 125, such as a cell phone or automobile, the battery specifications, and/or any other suitable parameters. For example, in the case of a battery-powered automobile, the fuel gauge circuit 150 may perform the health check every 6 months.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for managing a battery, comprising:
   a fuel gauge circuit coupled to the battery and comprising:
      a voltage sensor coupled to the battery and configured to measure a battery voltage;
      a current sensor coupled to the battery and configured to measure a battery current;
      a logic unit coupled to the voltage and current sensors, wherein the logic unit is configured to compute:
         a first battery resistance according to a first measured voltage and a first measured current; and
         a second battery resistance according to a second measured voltage and a second measured current; and
      a memory coupled to the logic unit and configured to store battery characteristic data;
   wherein the fuel gauge circuit is configured to:
      measure a relative state of charge (RSOC) value of the battery;
      compute a change in resistance value, wherein the change in resistance value is the difference of two resistance values;
      determine an aged capacity value using the computed change in resistance; and
      generate a control signal according to the aged capacity value to manage charge of the battery.

2. The apparatus according to claim 1, wherein the battery characteristic data comprises:
   a new battery resistance value; and
   a relationship between a change in resistance and battery capacity.

3. The apparatus according to claim 1, wherein:
   the fuel gauge circuit computes the first resistance when the measured RSOC value equals a first predetermined RSOC value; and
   the fuel gauge circuit computes the second resistance when the measured RSOC value equals a second predetermined RSOC value.

4. The apparatus according to claim 3, wherein the fuel gauge circuit is further configured to compute a first change in resistance value according to the first battery resistance and the battery characteristic data.

5. The apparatus according to claim 4, wherein the fuel gauge circuit is further configured to compute a second change in resistance value according to the second battery resistance and the battery characteristic data.

6. The apparatus according to claim 5, wherein the fuel gauge circuit is further configured to compute a third change in resistance value based on the first change in resistance value and the second change in resistance value.

7. The apparatus according to claim 1, wherein the fuel gauge circuit is further configured to:
   determine a first aged capacity value according to a change in resistance due to cycle aging;
   determine a second aged capacity value according to a change in resistance due to calendar aging; and
   determine a third aged capacity value according to a change in resistance due to both cycle and calendar aging.

8. The apparatus according to claim 7, wherein the fuel gauge circuit is further configured to generate the control signal according to the first, second, and third aged capacity values.

9. An apparatus for managing a battery, comprising:
   a fuel gauge circuit coupled to the battery and configured to:
      determine a first aged capacity value due to cycle aging using a first change in resistance value obtained by a first subtraction function;
      determine a second aged capacity value due to calendar aging using a second change in resistance value obtained by a second subtraction function;
      compare the first and second aged capacity values; and
      control charging of the battery according to the comparison of first and second aged capacity values.

10. The apparatus according to claim 9, wherein the fuel gauge circuit is further configured to:
    measure a first resistance at a first predetermined relative state of charge (RSOC) value; and
    measure a second resistance at a second predetermined RSOC value.

11. The apparatus according to claim 10, wherein the fuel gauge circuit is further configured to:
    compute a first change in resistance according to the first resistance and new battery characteristic data; and
    compute a second change in resistance based on the second resistance and new battery characteristic data.

12. The apparatus according to claim 11, wherein the fuel gauge circuit is further configured to determine a third aged capacity value according to the first change in resistance.

13. The apparatus according to claim 11, wherein the fuel gauge circuit is further configured to compute a third change in resistance based on the first change in resistance and the second change in resistance.

14. The apparatus according to claim 13, wherein the fuel gauge circuit is further configured to:

determine the first aged capacity value according to the second change in resistance;

determine the second aged capacity value according to the third change in resistance; and restrict charging of the battery if the second aged capacity value is greater than the first aged capacity value.

15. The apparatus according to claim 9, wherein the fuel gauge circuit is further configured to restrict charging of the battery the second aged capacity value is greater than the first aged capacity value.

16. An apparatus for managing a battery, comprising:
a fuel gauge circuit coupled to the battery and configured to:
store new battery characteristic data and aged battery characteristic data;
measure a voltage of the battery;
measure a current of the battery;
measure a relative state of charge (RSOC) value of the battery;
compute a resistance of the battery;
compute a change in resistance value of the battery;
utilize the aged battery characteristic data to:
determine a first aged capacity value according to a change in resistance due to cycle aging;
determine a second aged capacity value according to a change in resistance due to calendar aging; and
generate a control signal according to the first and second aged capacity values to manage a charge of the battery.

17. The apparatus according to claim 16, wherein the fuel gauge circuit is configured to:
compute a first resistance value according to the measured voltage and measured current when the measured RSOC value equals a first predetermined RSOC value; and
compute a second resistance value according to the measured voltage and measured current when the measured RSOC value equals a second predetermined RSOC value.

18. The apparatus according to claim 17, wherein the fuel gauge circuit is further configured to:
compute a first change in resistance value according to the computed first resistance value and the new battery characteristic data;
compute a second change in resistance value according to the computed second resistance value and the new battery characteristic data.

19. The apparatus according to claim 16, wherein the control signal is based on the comparison of the first and second aged capacity values.

20. The apparatus according to claim 16, wherein the fuel gauge circuit further utilizes the battery characteristic data to determine a third aged capacity value according to a change in resistance due to both cycle and calendar aging.

* * * * *